United States Patent [19]
Cronin et al.

[11] Patent Number: 5,677,563
[45] Date of Patent: Oct. 14, 1997

[54] GATE STACK STRUCTURE OF A FIELD EFFECT TRANSISTOR

[75] Inventors: John Edward Cronin, Milton; Carter Welling Kaanta, Colchester; Randy William Mann; Darrell Meulemans, both of Jericho; Gordon Seth Starkey, Essex Junction, all of Vt.

[73] Assignee: International Business Machines Corporation, Armonk, N.Y.

[21] Appl. No.: 784,720

[22] Filed: Jan. 16, 1997

Related U.S. Application Data

[60] Continuation of Ser. No. 410,433, Mar. 23, 1995, abandoned, which is a division of Ser. No. 245,997, May 19, 1994, Pat. No. 5,496,771.

[51] Int. Cl.$^6$ .................. H01C 29/00; H01C 21/44; H01J 1/62
[52] U.S. Cl. .................. 257/506; 257/752; 257/900; 257/903; 257/915; 437/187; 437/235; 437/236; 313/512; 313/306; 313/309
[58] Field of Search .................. 257/900, 915, 257/306, 374, 397, 513, 752, 903, 506; 437/187, 235, 236, 195, 40, 52, 47, 60, 200; 313/512, 306, 309, 310

[56] References Cited

U.S. PATENT DOCUMENTS

| | | | |
|---|---|---|---|
| 4,564,854 | 1/1986 | Ogura | 257/296 |
| 4,922,311 | 5/1990 | Lee et al. | 257/915 |
| 5,087,584 | 2/1992 | Wada et al. | 437/43 |
| 5,308,783 | 5/1994 | Krautschneider et al. | 437/52 |
| 5,541,427 | 7/1996 | Chappell et al. | 257/306 |

*Primary Examiner*—Carl W. Whitehead, Jr.
*Attorney, Agent, or Firm*—Heslin & Rothenberg, P.C.

[57] ABSTRACT

A semiconductor structure comprising two gate stacks of equal height but different composition. The two gate stacks each comprise two layers, with the first layer of each gate stack comprising the same material and the second layer of each gate stack comprising a different material. Each gate stack has an upper surface a distance 'X' above the upper planar surface of a substrate of the semiconductor structure. Thus, the two gate stacks of different composition are of identical height.

9 Claims, 7 Drawing Sheets

GATE STACK STRUCTURE OF A FIELD EFFECT TRANSISTOR

This application is a continuation of application Ser. No. 08/410,433, filed Mar. 23, 1995, now abandoned, which is a divisional application of Ser. No. 08/245,997 filed May 19, 1994, U.S. Pat. No. 5,496,771, issued Mar. 5, 1996.

TECHNICAL FIELD

The present invention relates in general to semiconductor devices and to semiconductor device fabrication methods. More specifically, the invention relates to stack structures for semiconductor devices employing local interconnects, and in particular, to a dual functioning overpass mask/insulator for isolating a gate stack from an overpass conductor at the M0 wiring level. The invention also relates to methods for fabricating such stack structures and such a dual functioning overpass mask/insulator.

BACKGROUND ART

The formation of closely-spaced integrated circuits on the same silicon wafer is well known, as is technology for conductive interconnection of such circuits. By way of example, once often required interconnect is the wiring of the gate of a Complementary Metal Semiconductor (CMOS.) Field-Effect Transistor (FET) to the diffusion of an adjacent FET. Another common, but more complicated interconnection is that between adjacent diffusions of an FET, without a conductive contact to the intervening gate.

Traditional interconnection techniques use contact holes and wire metallurgy to form desired wiring levels. Such techniques typically involve the deposition of a conformal metal layer(s) over the devices and/or substrates, and a subsequent etch of the metal layer(s) from areas not requiring electrical contact. One such interconnection technique is described in detail in U.S. Pat. No. 4,933,743 entitled "HIGH PERFORMANCE INTERCONNECT SYSTEM FOR AN INTEGRATED CIRCUIT." Briefly, a technique is described therein in which contact holes are etched from a dielectric layer to expose device contact areas. A conformal metal layer is formed over the structure, patterned and then etched to form a level of interconnect. Unfortunately, the non-planar surfaces formed by etching the conformal metal layer complicate the subsequent formation of additional layers or devices.

A recent alternative approach, referred to as local interconnect(s), begins with an insulator being blanket-deposited over a substrate and any devices formed thereon. This blanket insulator is then selectively etched to expose desired device contacts. An inlaid metal structure is deposited in the etched region to electrically contact the exposed device contacts. This metal structure is then planarized with the remaining insulator. The local interconnection technique is used to electrically contact devices beneath the first wiring level, which is formed as described above. The technique avoids problems associated with multiple wiring layers. In particular, the inlaid metal has less resistance, supports connections of very short lengths and is generally stronger than conformal wiring. One specific embodiment of the local interconnect technique is described in U.S. Pat. No. 4,789,648, entitled "METHOD FOR PRODUCING COPLANAR MULTI-LEVEL METAL/INSULATOR FILMS ON A SUBSTRATE AND FOR FORMING PATTERNED CONDUCTIVE LINES SIMULTANEOUSLY WITH STUD VIAS," assigned to the same assignee as the present application. The etch and mask sequences described therein are generally known in the art as damascene techniques and sometimes referred to herein as "damascening".

Currently, a necessary result of this technique is that the inlaid metal structure, or stud, will electrically contact all gate stacks of the devices exposed by the insulator etch. Multiple gates or diffusions may be exposed and thus contacted. Using selective etching, an effective interconnect between a gate and an adjacent diffusion is possible. However, a local interconnection between diffusions that remains insulated from the intervening gate has not been accomplished.

A need therefore exists for techniques that will allow an inlaid, local interconnect to selectively contact certain gate stacks and remain insulated from others. The techniques should offer a circuit designer flexibility and provide options based on available processing technologies. The resulting structures should have precisely-formed, predictable shapes and electrical characteristics. Further, the fabrication technique should not diminish the electrical response of current circuit designs, and should not involve overly complex fabrication steps.

DISCLOSURE OF INVENTION

Briefly summarized, the invention comprises in a first aspect a method for fabricating a semiconductor structure including the steps of: damascening a first mask of electrically insulative material into an electrically conductive material; forming a second mask above the electrically conductive material; using both the first mask and the second mask to define a conductor image for an overpass conductor; and retaining the first mask as an overpass insulator electrically insulating a portion of the electrically conductive material from the overpass conductor.

In another aspect, the invention comprises a method for forming a gate stack which includes the steps of: providing a layer of electrically conductive material above an upper surface of a substrate; damascening an electrically insulative layer into the layer of electrically conductive material; and etching the layer of electrically conductive material and the electrically insulative layer to form the gate stack, wherein a portion of the layer of electrically conductive material and a portion of the electrically insulative layer comprise the gate stack and are self-aligned.

In still another aspect, a fabrication method is presented for forming two gate stacks of equal height but different composition above an upper surface of a substrate. The method includes: forming a first layer of material above the upper surface of the substrate in a first area; forming two layers of material above the upper surface of the substrate in a second area, wherein an interim semiconductor structure is defined having multiple layers above the upper surface of the substrate; and planarizing an upper surface of the interim semiconductor structure such that formation of a first gate stack in the first area and a second gate stack in the second area results in two gate stacks of different composition but equal height above the upper surface of the substrate.

In a further aspect, a method for fabricating a gate stack and an overpass conductor is provided. The method includes forming the gate stack above a substrate in part by damascening an insulator layer into a conductor layer; using the portion of the insulator layer in the gate stack has an overpass mask to partially define a conductor image for the overpass conductor; and forming the overpass conductor above the gate stack such that the overpass conductor is insulated from the portion of the conductor layer in the gate stack by the insulator layer in the gate stack.

Structurally the invention comprises in a first aspect a stack structure, disposed above a substrate, which includes a conducting layer and an insulating layer disposed above the conducting layer. An overpass conductor surrounds the stack structure such that the insulating layer electrically insulates the conducting layer from the overpass conductor. Preferably, the conducting layer and the insulating layer are self-aligned. Further details of this semiconductor structure are described herein.

In a still further aspect, a semiconductor structure is presented including a first gate stack and a second gate stack. The first gate stack has a first composition and an upper surface located a distance 'X' above an upper surface of a substrate. Similarly, the second gate stack has an upper surface at a distance 'X' above the upper surface of the substrate. The second gate stack has a second composition which includes an upper layer and a lower layer.

To summarize, the present invention comprises novel methods/structures that greatly improve the utility of local interconnects. With these methods and structures, inlaid local interconnects can selectively contact some exposed devices and remain insulated from others. Alternate processing steps are provided that offer designers options based on available technologies. Further, the resulting structures are precisely shaped for improved device performance and functionality in advanced semiconductor systems.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following detailed description of certain preferred embodiments and the accompanying drawings in which:

BEST MODE FOR CARRYING OUT THE INVENTION

Figure 1A:
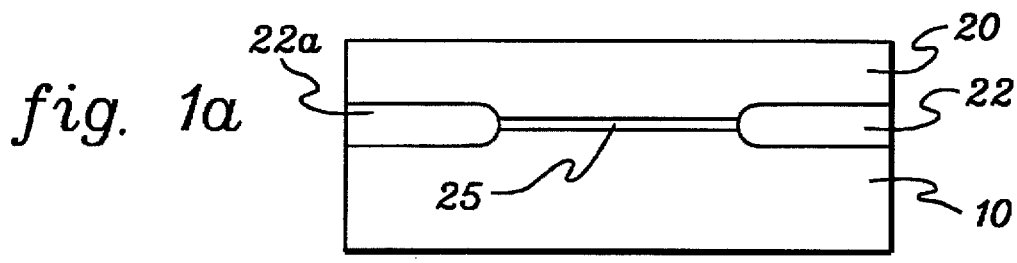
FIGS. 1(a)–1(g) are cross-sectional views of semiconductor structures obtained at different processing stages of a first fabrication method in accordance with the present invention; specifically, shown are two transistor gate stacks and associated diffusions obtained at the various processing steps.

Broadly stated, the present invention comprises a semiconductor interconnect structure and fabrication method. In particular, semiconductor structures are provided wherein stack components are electrically insulated from a surrounding layer of inlaid, local interconnect material. The insulating function is partially accomplished with self-aligned overpass insulators selectively embedded below the metal interconnect material.

As discussed below, local interconnect fabrication involves depositing a blanket layer of an insulator over the stack structures and then etching the layer to form a mask that defines a conductor image. A modification of the etching pattern is possible to leave insulators on gates not requiring contact to the local interconnect. However, this modified etching technique can create alignment problems between the gate, the inlaid conductor, and other exposed devices.

More specifically, in the typical fabrication process, polysilicon gate stacks are formed as a group and exposed by common etching steps. These gate stacks, as a group, may include insulators disposed thereon. The devices are then fully surrounded with additional insulator material which, upon etching, serves as a boundary material which defines a conductor image for the inlaid metal. The elevation of this insulator layer above the substrate exceeds that of any of the devices and/or contacts. Removing previously-applied insulators from gate stacks requiring electrical contact during this etch requires a mask that is perfectly aligned to the now-submerged gate stack. Because accurate mask alignment is impossible, remaining portions of the insulator will adversely affect subsequent formations. In particular, the subsequently deposited conductor will likely be misaligned to the lower devices thereby adversely affecting the overall electrical characteristics of the device.

Further, reactive ion etching (RIE) is not possible given the lower device areas to be selected, and wet etch is not possible due to the bias created as well as the temperature and chemical incompatibilities of the wet etch to the insulator itself.

As the processing proceeds, additional problems arise. During the addition and planarization of inlaid metal, other gate stacks, which might be exposed and require electrical contact, will have different stack heights than those of the insulated stacks. Conformally-deposited spacer layers will therefore form irregularly on the surfaces of the different stacks. Lateral distances, measured between points on adjacent gates, will thus be inconsistent. This is a significant problem for applications requiring constant device lengths between gates, e.g., for specialized circuit designs. Although not desirable, the use of complicated etching sequences is possible to alleviate these problems.

All of the above-mentioned problems are avoided by the novel methods and structures described in the following embodiments.

A first embodiment of the invention comprises a fabrication method for producing a dual functioning, self-aligned overpass mask/insulator. Second, third and fourth fabrication embodiments entail modifications and improvements to the first embodiment and accommodate various processing technologies to produce structures with different physical and electrical characteristics.

Figure 1B:
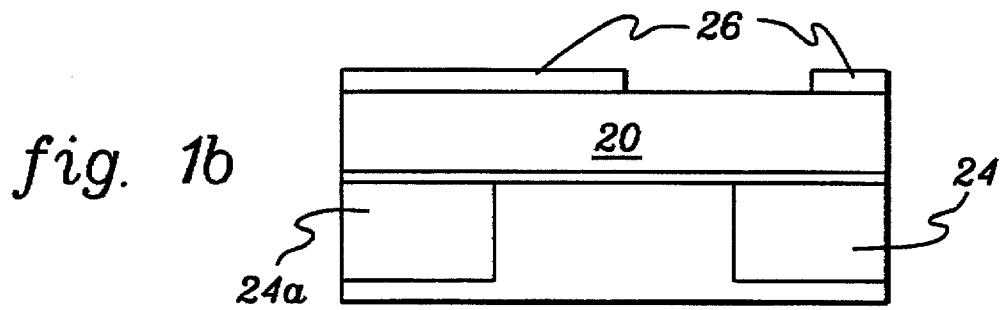
Figure 1C:
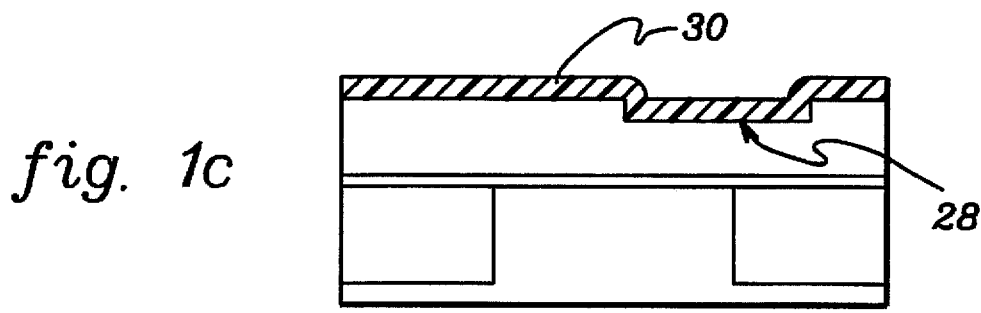
Figure 1D:
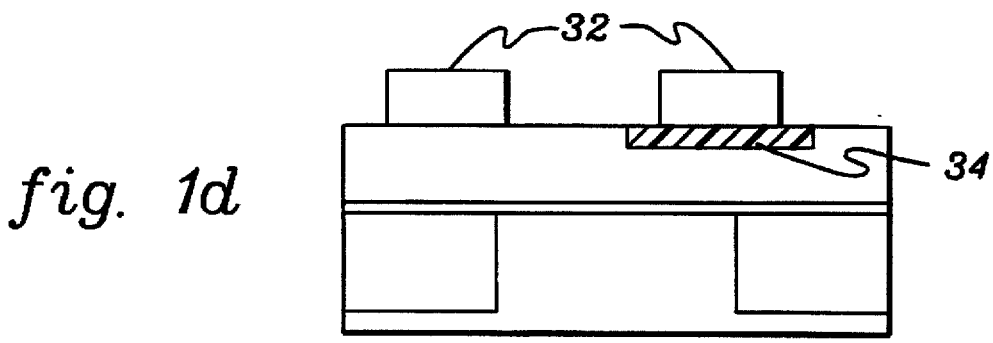
Figure 1E:
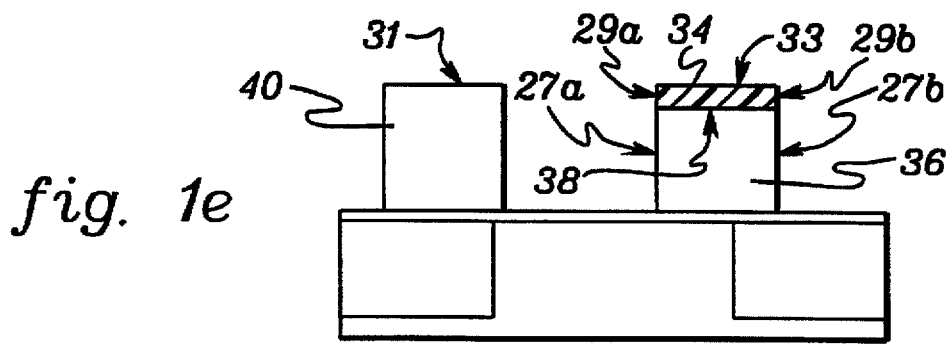
Figure 1F:
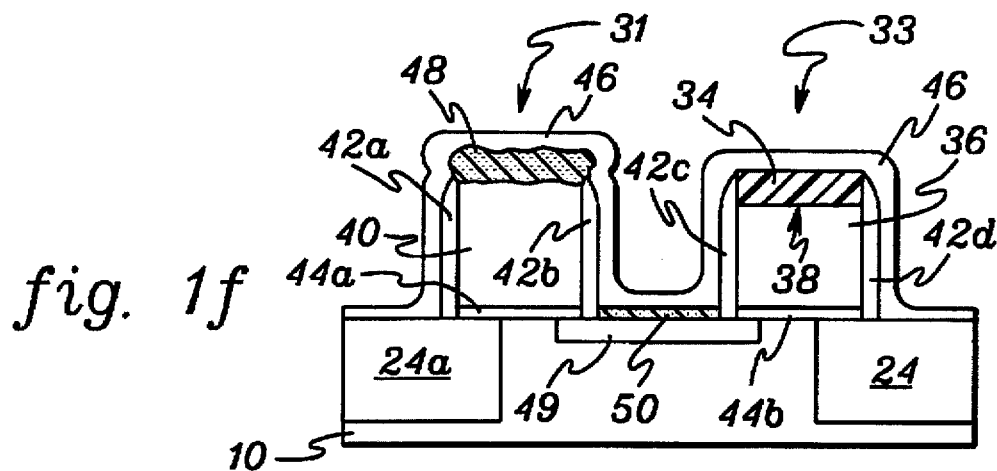
Figure 1G:
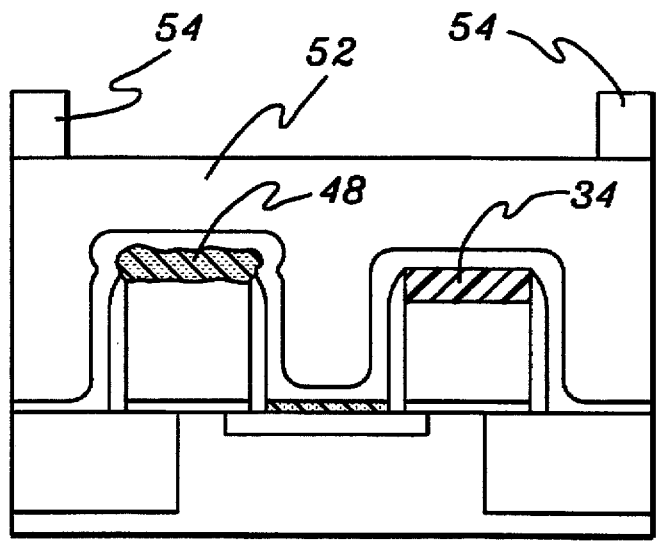
Figure 1H:
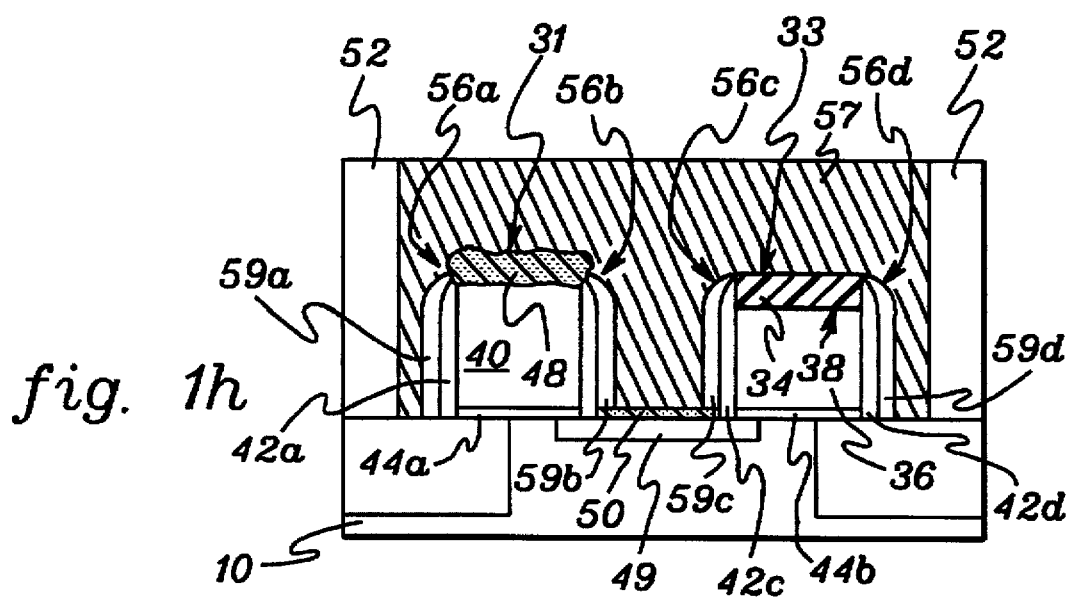
FIG. 1(h) is a cross-sectional view of a resultant semiconductor structure in accordance with the present invention employing the processing approach of FIGS. 1(a)–1(g)

Referring initially to FIG. 1h, a semiconductor structure fabricated in accordance with the first embodiment of the present invention is shown to comprise two stack structures 31 and 33, and an inlaid layer of conductive material 57 surrounding the structures. The conductive material is a metal such as tungsten with barriers like titanium nitride, as well as other materials like copper or aluminum-copper. The stack structures, which reside above a substrate 10, include gate oxides 44a and 44b. In this particular structure, the stacks share a diffusion 49 in substrate 10.

Referring particularly to stack structure 33, a gate 36 is shown disposed over gate oxide 44b. Gate 36, e.g., composed of a heavily-doped polycrystalline silicon layer, electrically controls a depletion region in substrate 10, i.e., across gate oxide 44b. An overpass insulator 34 is shown disposed on an upper surface 38 of the gate 36. Oxide spacers 42c and 42d extend from overpass insulator 34 to the substrate 10, along the sidewall(s) of gate 36. Similarly, nitride barriers 59c and 59d are disposed along the outer surfaces of oxide spacers 42c and 42d. Gate 36 is therefore totally electrically insulated from inlaid conductive material 57 that forms the local interconnect. As shown, a significant component of this insulating structure comprises overpass insulator 34. This insulator, having been formed simultaneously with gate 36, is self-aligned with the gate and comprises part of stack structure 33.

In contrast to insulated stack structure 33, stack structure 31 and diffusion 49 each electrically contact inlaid conductive material 57. Referring particularly to stack structure 31, oxide spacers 42a and 42b and residual nitride barriers 59a and 59b extend along the sidewall(s) of gate 40. The upper layer 48 of structure 31 comprises a conducting layer, e.g., composed of a gate silicide. This layer serves as the ohmic contact between inlaid conductive material 57 and gate 40. Similarly, diffusion 49 electrically contacts conductive material 57 via a diffusion silicide 50.

To summarize, in accordance with the invention, gate 36 is fully insulated from conductive material 57, while other local structures electrically contact material 57, e.g., gate 40 and diffusion 49. In addition, the height of stack structures 31 (before silicidation) and 33 are equivalent because of the mask and etch sequences employed (described below). This equivalent height allows spacers of equivalent width to form along the outer surfaces of the stack structures.

Figure 2A:
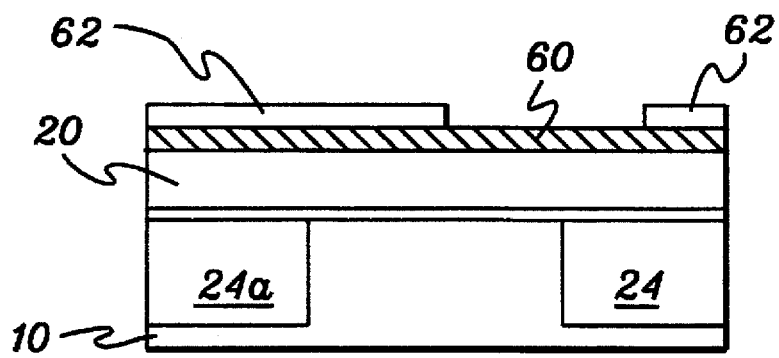
FIGS. 2(a)–2(e) are cross-sectional views of semiconductor structures obtained at different processing stages of a second fabrication method in accordance with the present invention.
Figure 2B:
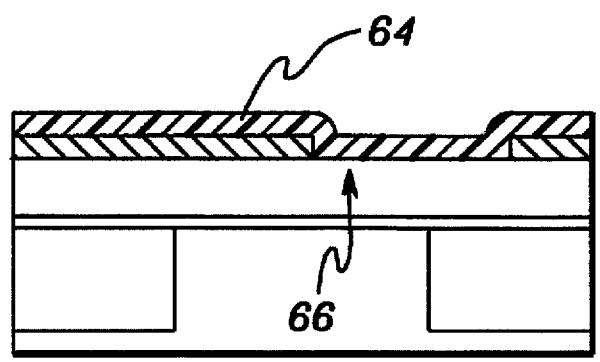
Figure 2C:
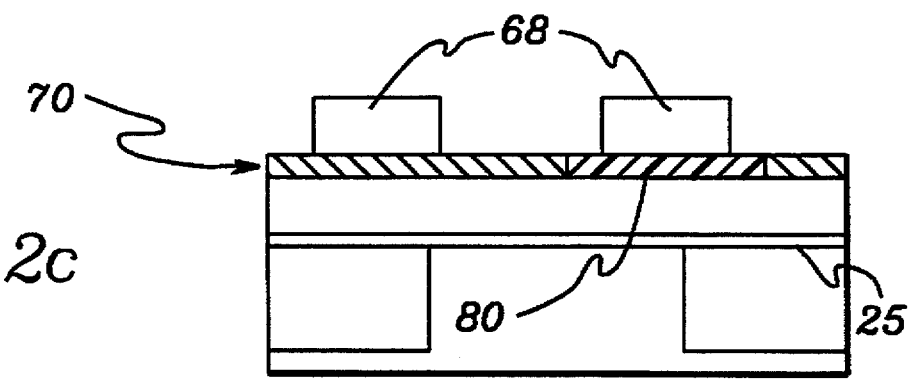
Figure 2D:
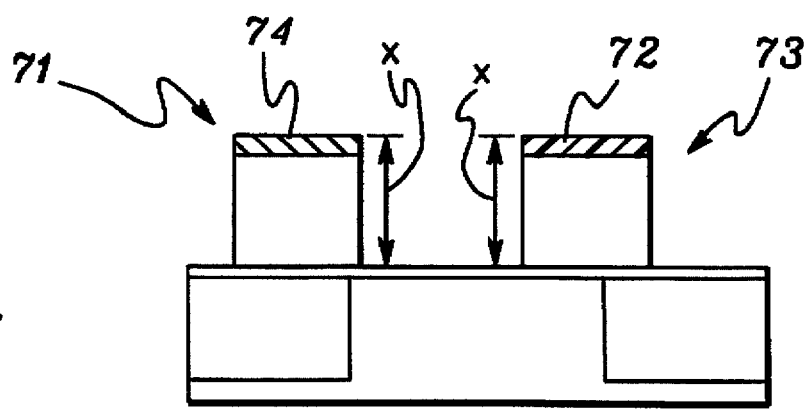
Figure 2E:
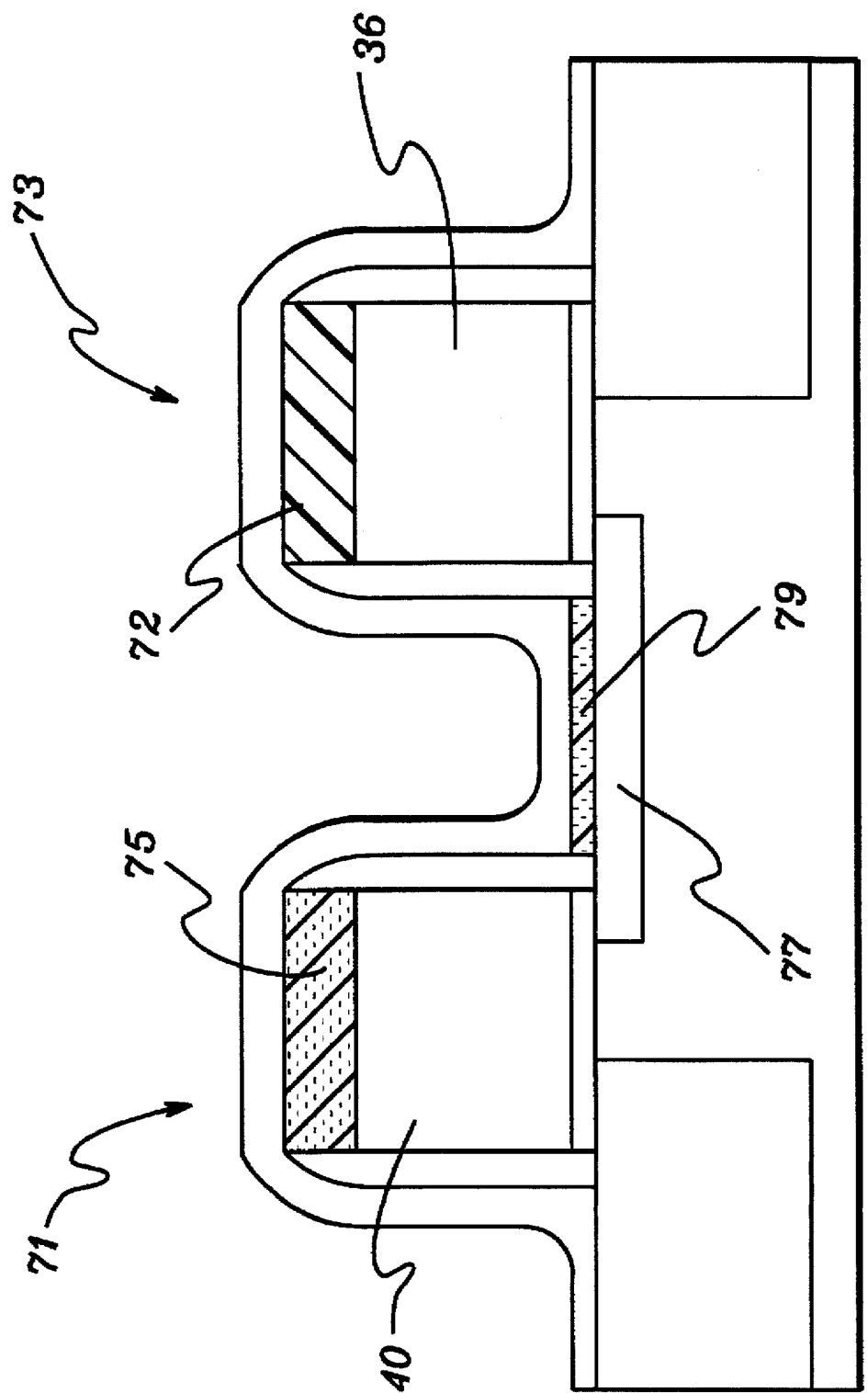

Referring next to FIG. 2e, a semiconductor structure fabricated in accordance with second and third embodiments of the invention is presented. FIG. 2e again depicts two stack structures 71 and 73. Stack structure 71 includes a self-aligned gate 40 and a gate silicide 75, which is decoupled in thickness from an optional silicide 79 above diffusion 77. This is accomplished by forming the two silicides independently. In addition, the elevation of both stack structures above the substrate is equivalent. An inlaid conductive layer (not shown) formed around the structures shown, would again electrically contact gate silicide 75 and silicide 79, but not gate 36.

Figure 4A:
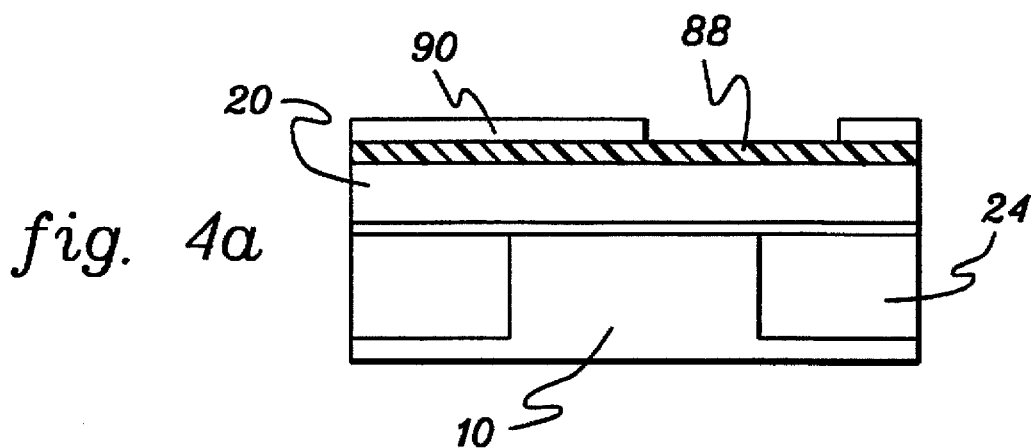
FIGS. 4(a)–4(g) are cross-sectional views of semiconductor structures obtained at different processing stages of a fourth fabrication method in accordance with the present invention.
Figure 4B:
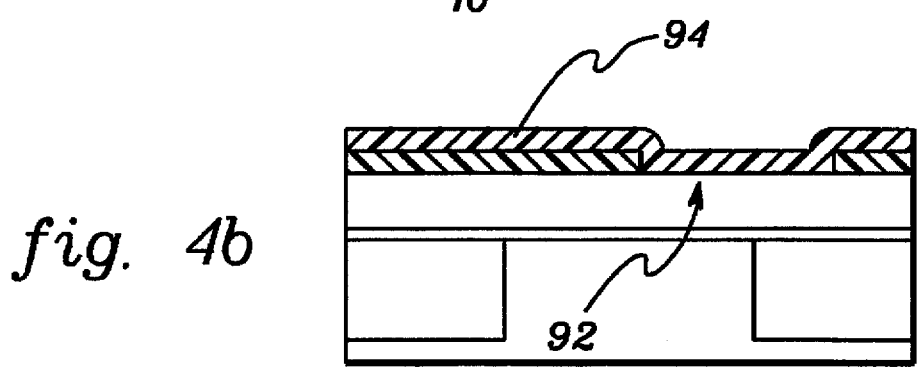
Figure 4C:
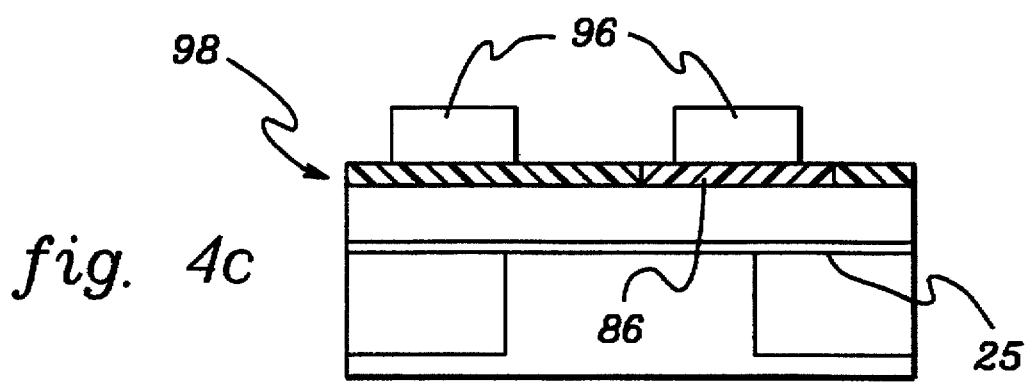
Figure 4D:
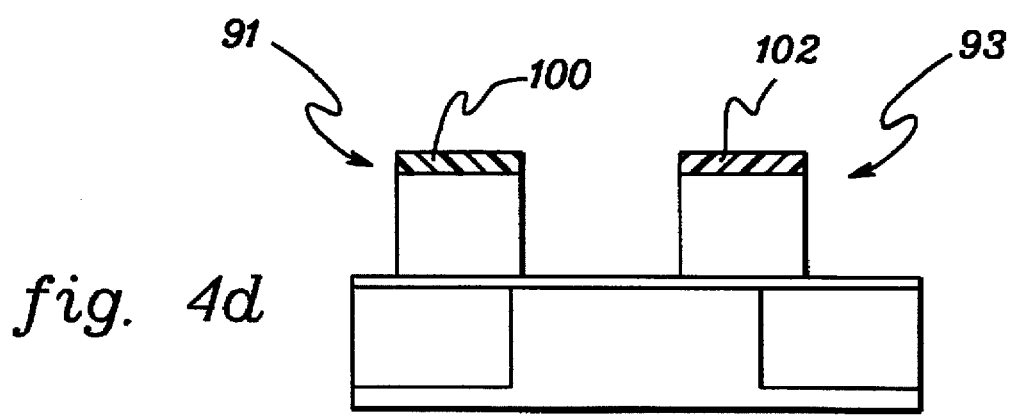
Figure 4E:
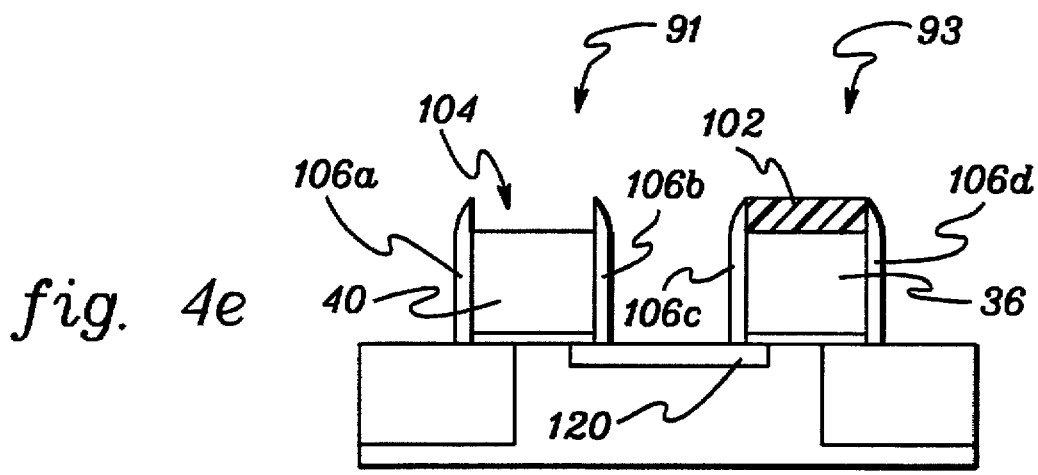
Figure 4F:
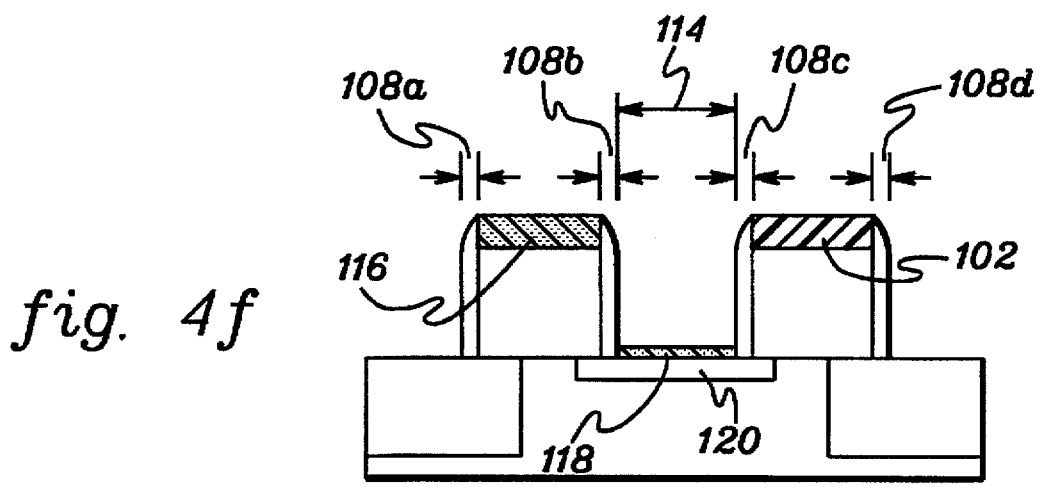
Figure 4G:
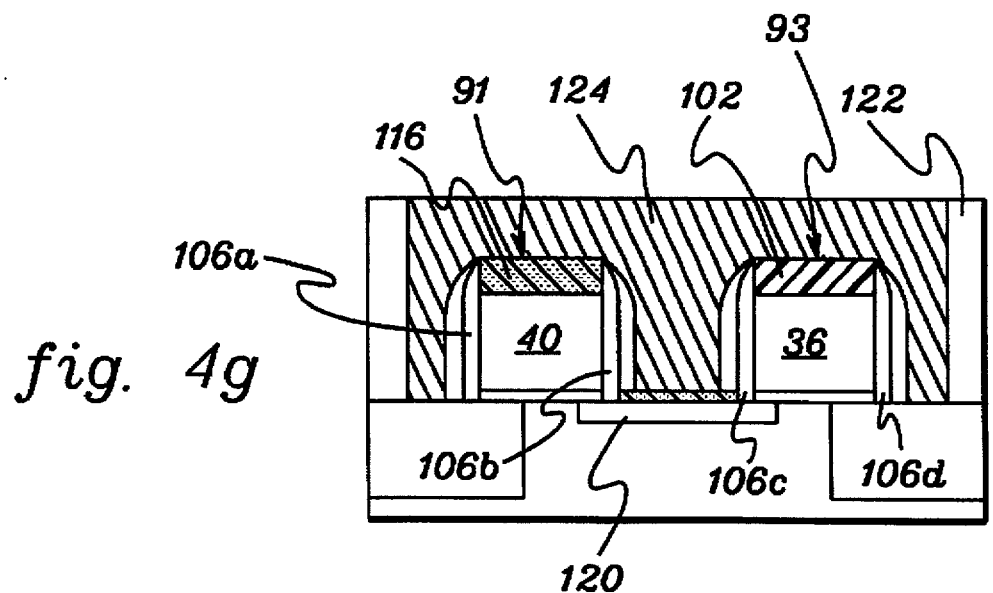

FIG. 4g depicts a semiconductor structure fabricated in accordance with a fourth embodiment of the invention. Stack structures 91 and 93 are similar to the structures discussed above in connection with FIG. 2e; however, an improvement in the etching sequence in the fourth embodiment allows both embedded silicide 116 and overpass insulator 102 to be formed without complicated etching sequences. The various fabrication sequences in accordance with the present invention are next described in detail.

FIRST EMBODIMENT

Broadly stated, the first fabrication embodiment is a method by which a dual functioning overpass mask/insulator is formed on a gate stack that insulates the gate stack from an inlaid local interconnect. The mask/insulator is formed contemporaneously with the gate and is self-aligned to the gate. The mask/insulator, composed of a non-erodible material, protects the gate from the etch performed defining the conductor image for the local interconnect. Finally, the mask/insulator is retained to function as an overpass insulator during the operation of the circuit.

In FIG. 1a a CMOS fabrication process is assumed. The initial topography includes a substrate 10 with a thin oxide layer 25 grown thereon that will eventually function as a gate oxide. Also provided are a recessed oxide layers 22 and 22a, which function as isolation regions, and are selectively grown from thin oxide layer 25. The isolation regions could alternatively be formed by shallow trench isolation in which grooves in the substrate are formed and filled with oxide. The oxide is then planarized back, resulting in isolation oxides 24 and 24a shown in FIG. 1b.

A conductive layer 20, such as polysilicon, is blanket deposited over the oxide and a planarization is performed, e.g., using blind polishing or other, similar techniques. A mask and etch step is next performed. In FIG. 1b, mask 26 is defined and used to create etched region 28 in layer 20 (see FIG. 1c). An insulative layer 30 is then conformally deposited and planarized back using chem-mech polishing ("CMP") or other appropriate means. As known, chem-mech polishing employs selective slurries which have different removal rates for substances with different etch rates for producing co-planar films. The techniques are described in U.S. Pat. No. 4,944,836 to Beyer et al., entitled "CHEM-MECH POLISHING METHOD FOR PRODUCING COPLANAR METAL/INSULATOR FILMS ON A SUBSTRATE," which is hereby incorporated herein by reference. Insulative layer 30 is composed of a non-erodible insulative material such as silicon nitride, $Si_3N_4$. Overpass insulator 34 is thereby formed, and is coplanar with an upper surface of conductive layer 20 (FIG. 1d). A second mask 32 is then employed to define the gate stack structures (FIG. 1e). These structures result from etching the interim structure of FIG. 1d.

Alternative etching techniques are available to produce the stack structures using second mask 32. First, the exposed areas of overpass insulator 34 could have been etched, followed by an etch of conductive layer 20 with thin oxide layer 25 serving as an etch stop. Given the good etch ratio of polysilicon to the thin oxide etch stop, the differential thickness of the polysilicon layer caused by the first nitride etch should not result in a premature removal of the thin oxide layer. As a second alternative, etching conductive layer 20 and thin oxide layer 25 at the same rate could have been employed. Another alternative would be to etch conductive layer 20 to the bottom level of overpass insulator 34, then etch the exposed areas of overpass insulator 34, followed by an etch of the remaining conductive layer 20 to the thin oxide layer 25. This latter etch is complicated but has one advantage in that gate 40, by undergoing a preliminary etch at its upper surface, has an equivalent thickness of polysilicon and no absorption of the subsequent etch is necessary at the etch stop.

Following the etch, the semiconductor structure shown in FIG. 1e remains. Mask 32 has been stripped by suitable means. It is important to note that the insulating characteristics of "mask" 34 will prevent electrical contact between gate 36 and a subsequently deposited local interconnect. Further, overpass mask/insulator 34, having been etched simultaneously with gate 36, is self-aligned therewith. Specifically, exposed side edges 29a and 29b of overpass insulator 34 and side surfaces 27a and 27b of gate 36 are aligned. This alignment is significant and results in an overall improvement in the electrical characteristics of the device, as described further below. Note that such alignment is not possible when the mask is formed subsequent to the formation of the gate. Masks formed subsequent to the formation of the gate have a tendency to extend beyond surfaces 27a–27b, thereby affecting the implantation of and connections to diffusions in the substrate.

FIG. 1f depicts the semiconductor structure remaining following further processing steps in accordance with the first embodiment. Specifically, spacer material (e.g. silicon oxide) is deposited over the entire structure. The formation of diffusion 49 is initiated using ion implantation. The spacer material and thin oxide layer 25 are etched, thereby forming spacers 42a–42d and gate oxides 44a and 44b. An anneal step is additionally performed to "drive in" the ion implantation, thereby completing the formation of diffusion 49.

Another feature of the invention is apparent at this stage, i.e., the precise formation of oxide spacers on the stack structures. Because the spacers are formed from a conformally deposited layer of oxide, and the fact that both stacks at this point in the processing (FIG. 1e) are of equal height, precise spacer formation is possible. Note that the deposition and etch of conformal spacers and their resultant dimensions are affected by the height of the underlying stack structures. Should the thickness of the conformal spacer approach or exceed fifty (50%) percent of the height of the stack structures, this effect becomes more pronounced. In turn, the widths of the spacers are related to device lengths, which are typically critical to circuit designers. Therefore, the present invention provides stack structures of different composition but of equal height at this processing stage.

Because this illustrative structure is assumed to involve a local interconnection between diffusion 49 and gate 40, gate silicide 48 and diffusion silicide 50 are preferably formed to facilitate the connection. These silicides can be formed by the deposition of a metal layer (not shown) composed of, for example, titanium, followed by thermal cycling. Silicide forms only where silicon is exposed to the metal layer, i.e., at the upper surface of gate 40 and above diffusion 49. A nitride barrier 46, for example, is then conformally deposited over the entire semiconductor structure to protect the devices from ionic contamination during subsequent processing.

The conductive material to comprise the local interconnect (i.e., MO level wiring) is next deposited and planarized pursuant to the "damascene" techniques described in U.S. Pat. No. 4,789,648 to Chow et al., entitled "METHOD FOR PRODUCING COPLANAR MULTI-LEVEL METAL/INSULATOR FILMS ON A SUBSTRATE AND FOR FORMING PATTERNED CONDUCTIVE LINES SIMULTANEOUSLY WITH STUD VIAS," assigned to the same assignee as the present application, and which is hereby incorporated herein by reference. Briefly described, damascening involves in one example depositing a planarized layer of insulation over a conductive material to which electrical contacts are to be established. An etch is performed, resulting in etching channels, wherein the underlying conductive material is exposed, thereby defining a conductor image. These channels are then overfilled with metallization and planarized with the remaining insulator, thereby forming a local interconnect. In the present example, gate 36 falls within such a channel, but is nevertheless insulated from the local interconnect.

Damascening can be further explained with reference to FIGS. 1g and 1h. Insulative layer 52, e.g., composed of sputtered quartz or a composite $Si_3N_4/SiO_2$ layer (deposited by CVD), is deposited and planarized over the entire semiconductor structure. The elevation of this layer corresponds to the thickness required for the local interconnect. A third mask 54, defined on the planar upper surface of insulative layer 52, facilitates vertical etching of layer 52 and barrier 46. Residual barrier spacers 59a–59d remain on the structures and a cavity is formed surrounding the stacks. The non-erodible characteristics of overpass insulator 34 prevent removal of the overpass insulator and material from gate 36.

After stripping mask 54, the cavity is filled with conductive material 57, which might comprise titanium nitride (TiN), which is followed by CVD tungsten and which functions as an overpass conductor. Finally, planarization of conductive material 57 and insulative layer 52 is performed, again using CMP or other suitable techniques.

To summarize, the resultant semiconductor structure, shown in FIG. 1h, and fabricated in accordance with this first processing embodiment of the invention, includes local interconnect 57 overpassing gate 36 but electrically contacting other illustrative devices such as gate 40 and diffusion 49. Overpass insulator 34, formed contemporaneously with gate 36, is self-aligned therewith, and the circuit will not suffer from image bias over the gate(s) and diffusion(s).

SECOND EMBODIMENT

The second embodiment of the invention, certain steps of which are illustrated in FIGS. 2a–2e, is a modification of the first processing embodiment and results in stack structures with improved dimensions and functionality. This processing embodiment generally involves the selective formation of conductive and insulative masks within an upper portion of the stack structures, again prior of formation to the stack structures, thereby resulting in self-aligned insulative and conductive masks.

FIG. 2a is similar to FIG. 1b described above, except conductive layer 60 has been deposited on conductive layer 20 and a mask 62 has been formed to remove a portion of the layer, resulting in cavity 66 in layer 60 (see FIG. 2b). Insulative layer 64 is then conformally deposited and planarized back using CMP or other appropriate means (FIG. 2c). A combined layer 70 containing at least one section 80 and a remaining portion of layer 60 results.

By way of example, conductive layer 60 could comprise tungsten (W), cobalt (Co) or titanium (Ti). Insulative layer 64 is preferably a non-erodible oxide or nitride. Note that the choice of materials for insulative layer 64 and conductive layer 60 are related. For example, if tungsten is used for layer 60, the remaining portions of the layer serve as an excellent polish stop for an oxide because of its low polish rate. The thickness of combined layer 70 is chosen to accommodate a thickness of silicide desired on a conducting gate, which is formed in subsequent steps.

FIG. 2c depicts the structure following planarization and the definition of a mask 68. An etch is next performed, resulting in the stack structures shown in FIG. 2d. As in the first embodiment, multiple etch sequences are possible, accounting for differing etch rates of the materials involved. In all embodiments, however, the materials of conductive layer 60, insulative layer 64, and conductive layer 20 are etched in the open areas defined by mask 68. FIG. 2d illustrates the resulting stack structures 71 and 73. Conductive mask 74 and overpass insulative mask 72 comprise integral portions of these stack structures.

Numerous features of a semiconductor structure pursuant to this embodiment are evident from FIG. 2d. First, stack structures 71 and 73 have equivalent heights 'X'. As discussed above, precise spacer formation requires devices of equivalent height above an upper surface of the substrate. Second, both conductive mask 74 and insulative mask 72 are formed simultaneously with their respective underlying gates and are therefore aligned to the gates. In contrast, stack structure 31 in FIG. 1f has a non-aligned gate silicide 48. Thus, as shown in FIG. 1h, edges 56a and 56b form irregularly in the area immediately surrounding gate silicide 48, i.e., in contrast to edges 56c and 56d in the area surrounding insulator 34. Further, when thermal cycled the pre-formed conductive mask 74 forms gate silicide 75 as shown in FIG. 2e. Silicide 75 is also aligned to the gate, and the formation of silicide 75 is essentially decoupled from the formation of silicide 79, which serves as the ohmic contact for diffusion 77. If contact is only required at gate 40, the formation of silicide 79 can be avoided altogether. Decoupled silicide formations are advantageous in that circuit designers can decrease or even eliminate silicon lost in a silicide reaction near the diffusion. As shown in FIG. 2e, processing of the circuit continues with the addition of spacers and barriers in preparation for the blanket insulation, etch, and formation of inlaid local interconnect as described above in connection with FIG. 1h.

THIRD EMBODIMENT

Figure 3A:
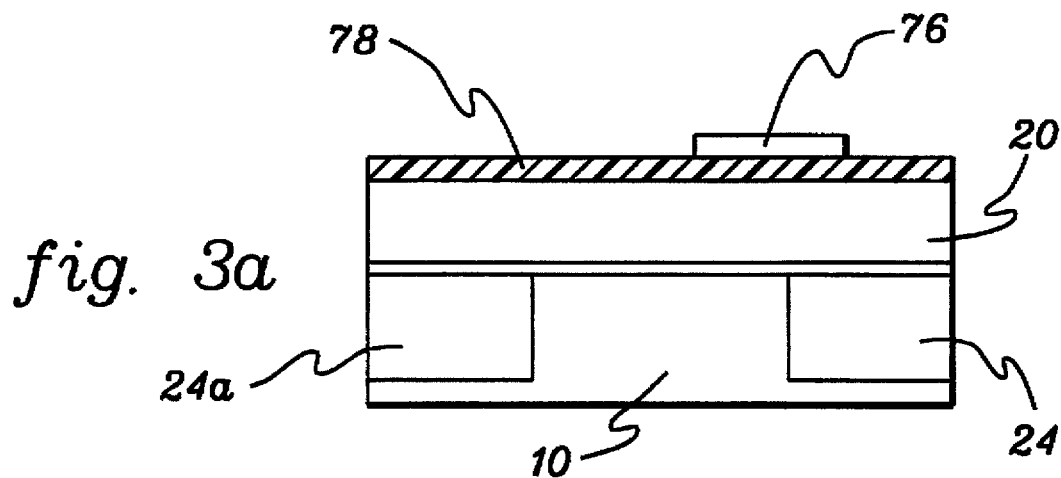
FIGS. 3(a)–3(c) are cross-sectional views of semiconductor structures obtained at different processing stages of a third fabrication method in accordance with the present invention.
Figure 3B:
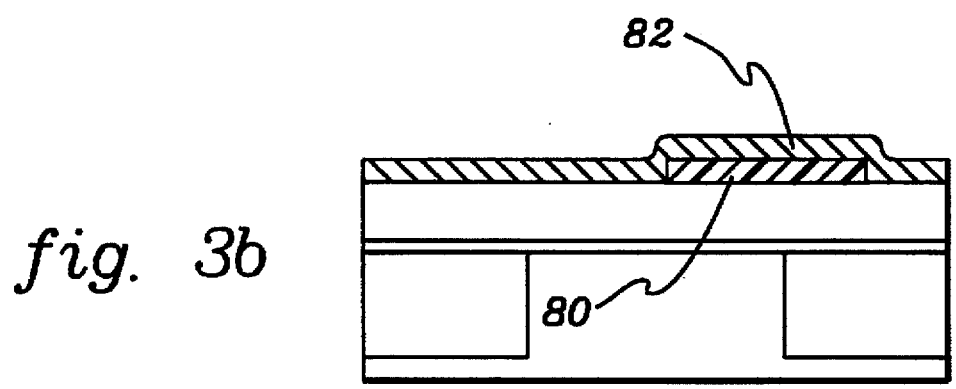
Figure 3C:
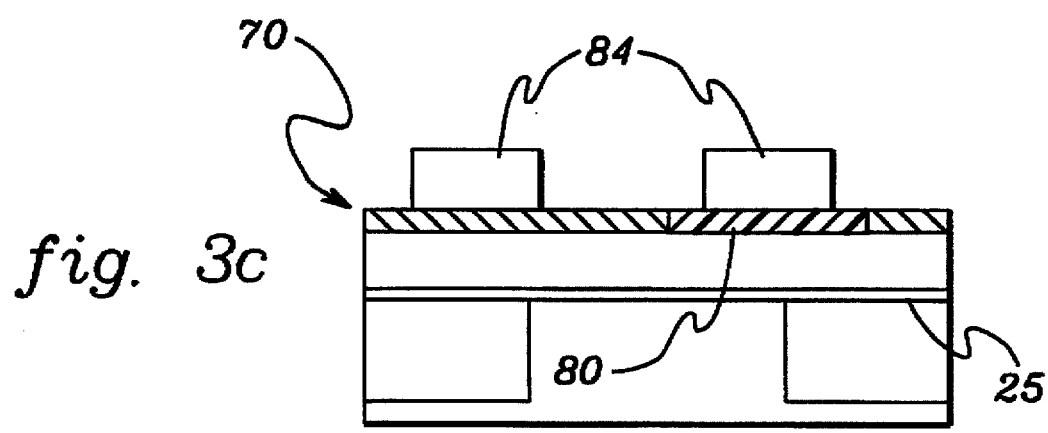

A third processing embodiment differs from the second embodiment only in how combined layer 70 is formed. The selection of which processing embodiment to use will be based on available etching and planarization technologies. As depicted in FIGS. 3a–3c, this embodiment changes the "polarity" of the applied masks. Specifically, as shown in FIG. 3a, an insulative layer 78 is formed above conductor 20 and mask 76 is defined thereon to preserve a portion of insulative layer 78 roughly in an area above the substrate to encompass a stack structure. Conductive layer 82 in FIG. 3b is then conformally applied and planarized. Identical materials may be used in this embodiment; for example, W, Ti or Co for conductive layer 82 and nitride or oxide for insulative layer 78. Following the planarization, mask 84 is defined as shown in FIG. 3c. From this point forward, the fabrication steps would be identical to those of the second embodiment. Note the identity between the resultant structures depicted in FIG. 2c and FIG. 3c. Again, the third embodiment is offered to accommodate different etching and planarization technologies.

FOURTH EMBODIMENT

A fourth processing embodiment of the present invention, illustrated in FIGS. 4a–4g, comprises additional refinements and processing options. Stated broadly, overpass masks are still employed and insulative (or conductive) masks remain on selected gates for insulating (or connecting to) the inlaid local interconnect. However, on gates where conductive masks are to be formed, a substitute material, e.g., oxide or nitride, is used in the initial etching sequence to lessen the complexities associated with the above-mentioned etching sequences. Following spacer formation on the gates, this substitute material is selectively wet-etched from the gate and replaced with the desired metal/silicide. Having used a silicon-based material for the substitute material, the planarization, etching and spacer formation can be more easily controlled.

Referring first to FIG. 4a, insulative layer 88, preferably composed of silicon nitride, is formed on conductive layer 20. A mask 90 is then defined and a cavity 92 is formed in layer 88 after etching (see FIG. 4b). Insulative layer 94, conformally applied, is preferably composed of silicon oxide. Planarization is performed, again employing CMP or other appropriate means. The remaining portions of insulative layer 88 serve as an adequate polish stop for insulative layer 94 because of the excellent polish ratio of oxide to nitride. Combined layer 98 results from the planarization, and mask 96 is defined as shown in FIG. 4c.

Continuing with FIGS. 4c and 4d, using mask 96, stack structures 91 and 93 are defined. Insulative masks 100 and 102 remain. As discussed above, a simpler etch sequence is employed. The sections of combined layer 98 can be etched simultaneously down to conductive layer 20 because the materials are preferably chosen such that the etch can be performed at the same rate, and such that none of layer 20 is etched or an equi-thickness of layer 20 is etched. Therefore, the materials and etches should be chosen to support similar etch ratios to polysilicon and a subsequent, selective wet etch. The nitride and oxide chosen in the preferred embodiment support both requirements. In particular, the chosen materials, oxide and nitride, can be employed with a $CF_4$ etch in oxygen, combined with an argon ion bombardment. This should result in approximately equivalent etch ratios of the oxide and nitride to polysilicon. A second etch, only of conductive layer 20, is then performed with thin oxide layer 25 serving as the etch stop. No differing thicknesses need be absorbed in the etch.

Oxide spacers 106a–106d are formed along the sidewalls of the resultant stack structures 91 and 93 as shown in FIG. 4e. The formation of the spacers, because of the silicon masks 100 and 102, continues as in previous embodiments. The resultant stack structures are advantageously the same height before spacer formation. As discussed above, mask 100 is now selectively wet-etched, and because the materials are initially chosen for this selective etch, no other materials or structures are affected. Cavity 104 is created and the upper edges of spacers 106a and 106b serve as boundaries for the formation of silicide 116 as shown in FIG. 4f. Silicide 116, because of the spacer boundaries, remains aligned to the underlying gate. Silicide 118 is also formed for diffusion 120.

Spacer widths 108a–108d, shown in FIG. 4f, represent the resultant widths of the oxide spacers 106a–106d. Device length 114 is highly dependent on spacer widths 108a–108d. Should a constant device length 114 be required for a certain application, the spacer widths 108a–108d must be equivalent. The presence of gate stacks of equivalent height during formation of oxide spacers 106a–106d guarantees spacer widths that can be tightly controlled. Further, by removing mask 100 and utilizing spacers 106a and 106b, a self-aligned silicide contact, silicide 116, is possible as discussed above.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

We claim:

1. A semiconductor structure comprising:

a first gate stack having a first composition and a planar upper surface a distance 'X' above a planar upper surface of a substrate, said first composition comprising a first layer and a second layer, said first layer comprising a first material and said second layer comprising a second material, said planar upper surface of said first composition comprising an upper surface of said second material; and a second gate stack having a second composition, said second composition including an upper layer and a lower layer, said lower layer comprising said first material and said upper layer comprising a third material, said third material being different than said second material, and said second gate stack having a plannar upper surface also at a distance 'X' above the upper surface of said substrate.

2. The semiconductor structure of claim 1, wherein said third material of said upper layer of said second gate stack comprises an electrically insulative material.

3. The semiconductor structure of claim 2, further comprising electrically conducting material substantially surrounding a portion of each of said first gate stack and said second gate stack, said electrically conducting material being in electrical contact with said first layer of said first gate stack and being electrically insulated from said lower layer of second gate stack by said upper layer, wherein said first material comprises a conductive material.

4. The semiconductor structure of claim 1, wherein said second layer of said first gate stack comprises an upper conductive layer.

5. The semiconductor structure of claim 1, wherein said first gate stack and said second gate stack comprise adjacent gate stacks and wherein said semiconductor structure further comprises a diffusion layer in said substrate between said first gate stack and said second gate stack.

6. The semiconductor structure of claim 5, wherein said second layer of said first composition of said first gate stack comprises a silicide having a thickness 'A', and wherein the semiconductor structure further comprises a layer of silicide disposed between said first gate stack and said second gate stack over said diffusion layer in said substrate, said silicide layer between said first gate stack and said second gate stack having a thickness 'B', wherein 'A'≠'B'.

7. The semiconductor structure of claim 1, further comprising a first oxide spacer extending along a sidewall of said first gate stack and a second oxide spacer extending along a sidewall of said second gate stack, said first oxide spacer and said second oxide spacer being of equal thickness.

8. The semiconductor structure of claim 1, wherein said upper and lower layers of said second gate stack are self-aligned.

9. The semiconductor structure of claim 8, wherein said first and second layers of said first gate stack are self-aligned.

* * * * *